United States Patent [19]

Hamano et al.

[11] Patent Number: 4,626,960
[45] Date of Patent: Dec. 2, 1986

[54] SEMICONDUCTOR DEVICE HAVING SOLDERED BOND BETWEEN BASE AND CAP THEREOF

[75] Inventors: Toshio Hamano; Kaoru Tachibana, both of Yokohama; Hideji Aoki, Machida, all of Japan

[73] Assignee: Fujitsu Limited, Kawasaki, Japan

[21] Appl. No.: 675,795

[22] Filed: Nov. 28, 1984

[30] Foreign Application Priority Data

Nov. 28, 1983 [JP] Japan ................................ 58-222191

[51] Int. Cl.$^4$ .............................................. H05K 7/20
[52] U.S. Cl. .................................... 361/388; 361/395; 357/80; 174/52 FP
[58] Field of Search ............... 361/386, 387, 388, 395, 361/401; 357/74, 80, 81; 174/52 FP, 52 S

[56] References Cited

U.S. PATENT DOCUMENTS 3,943,557 3/1976 Frazee ........................... 174/52 FP

FOREIGN PATENT DOCUMENTS 55-148445 11/1980 Japan .
0192054 11/1982 Japan ..................................... 357/81

OTHER PUBLICATIONS

IBM Tech Discl. Bull. vol. 19, No. 8, Jan. 1977, Pittwood, "Low-Temp-Modules", p. 2961.
IBM Tech Discl. Bull. vol. 20, No. 8, Jan. 1978, Francis, "Forming a Hermetic-Package", p. 3085.

Primary Examiner—G. P. Tolin
Attorney, Agent, or Firm—Armstrong, Nikaido, Marmelstein & Kubovcik

[57] ABSTRACT

A semiconductor device including a ceramic base having a cavity carrying a semiconductor chip, and a ceramic cap covering and sealing the ceramic base. The cap has a metallization pattern covering not only a region where it contacts the base but also the four side surfaces of the cap, which is provided in order to prevent flow or flying out of excess solder toward the outside of the cap and the base and into the cavity.

11 Claims, 10 Drawing Figures

1

SEMICONDUCTOR DEVICE HAVING SOLDERED BOND BETWEEN BASE AND CAP THEREOF

BACKGROUND OF THE INVENTION

1. Field of the Invention

The present invention relates to a semiconductor device, more particularly, to a semiconductor device including a semiconductor chip in a cavity on a ceramic base and a ceramic cap sealing the cavity.

2. Description of the Related Art

Heretofore, semiconductor chips have been emplaced in cavities of lead bases or leadless bases and sealed with caps. Generally, these caps have been made of metal for reasons of workability, solderability, cost, etc. For face-down type semiconductor devices, in which lead pins are provided at the face side of the base, for example, for provision of cooling fins at the rear of the base, the cap is preferably made of ceramic. This is because, when lead pins of such a semiconductor device are dipped in a molten solder bath to treat the outer surface of the lead pins or when such a semiconductor device is mounted onto a printed circuit board by soldering, adherence of solder onto the cap or formation of short-circuits between the lead pins and the cap may occur if the cap is made of metal.

In a semiconductor device including a ceramic base and a ceramic cap, the cap is bonded to the base by metallizing the two in the regions of contact and soldering them in the metallized regions. Soldering is carried out by inserting a thin ring pattern of solder between the ceramic base and cap, melting the solder while simultaneously pressing the cap against the base, and then cooling. The pressing of the cap is effected to prevent formation of voids in the soldering portion between the base and the cap since a ceramic cap is often somewhat warped.

However, we found that after soldering, excess solder flowed or flew from the soldering portion into the cavity of the base and outside the base and the cap, resulting in short-circuits and other defects of the semiconductor device. Such excess solder was often found at the corners of the cavity of the base. Further, there are problems in sealability, since solder did not cover the side surfaces of the cap or did not form a meniscus at the corners formed by the side surfaces of the cap and the top surface of the base due to absence of metallization on the side surfaces of the cap.

Japanese Unexamined Patent Publication (Kokai) No. 55-148445 disclosed formation of a separate pattern of metallization in addition to a pattern of metallization for soldering on an inner surface of a ceramic cap. The separate metallization pattern is formed at a portion spaced from and more inside than the metallization pattern for soldering on the surface of the cap facing the base. This separate metallization pattern is, however, not that effective for preventing the flow or flying out of excess solder toward the outside of the cap and the base and into a cavity of the base. Also, the problem of sealability between the cap and the base is not solved here.

SUMMARY OF THE INVENTION

The object of the present invention is to provide a semiconductor device comprised of a ceramic body carrying a semiconductor chip and a ceramic cap sealing the ceramic body, the ceramic body and ceramic cap being soldered to each other with reduced flying of excess solder.

Another object of the present invention is to provide a semiconductor device with a soldered ceramic cap wherein excess solder is retained by a metallized side wall of the ceramic cap.

Still another object of the present invention is to provide a semiconductor device eliminating the above-described problems in the prior art.

This object is attained according to the present invention by providing a semiconductor device including a semiconductor chip, an insulating base having a cavity for carrying the semiconductor chip, and a cap covering and sealing the cavity of the insulating base, in which the insulating base and the insulating cap have patterns of metallization in areas of contact therebetween, the pattern of metallization of the insulating cap extending from the area of contact with the base at least to the side surfaces of the insulating cap, and the insulating base and the insulating cap being soldered to each other in the areas of the patterns of metallization.

BRIEF DESCRIPTION OF THE DRAWINGS

The preferred embodiments of the invention are described below with reference to the drawings, in which.

DESCRIPTION OF THE PREFERRED EMBODIMENTS

Figure 1:
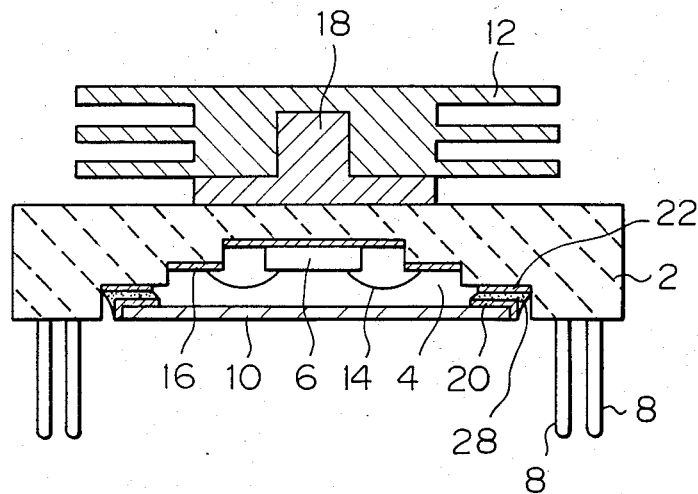
FIG. 1 is a sectional view of a face-down type semiconductor device according to the invention.

FIG. 1 illustrates a preferred embodiment of a semiconductor device according to the present invention. In FIG. 1, a face-down type semiconductor device is shown in cross-section, so that the orientation of the ceramic base, cavity, cap, etc. are reverse to that of a face-up type device. However, for uniformity, in describing the device construction, the "bottom" of the cavity is considered as the innermost or deepest part of the cavity opening in the base. Thus, in a face-down type device, the cavity "bottom" is above the cavity opening surface, whereas in a face-up type device, the cavity "bottom" is below the cavity opening surface. Similarly, the "top" of the base is that side opposite the cavity bottom. The semiconductor device comprises a ceramic base 2 of, e.g., alumina having a cavity 4, a semiconductor chip 6 mounted onto the base 2 at the bottom of the cavity 4, a plurality of lead pins 8 of, e.g., an iron-nickel alloy provided to the base 2 on the side where the cavity 4 is opened, a ceramic cap 10 of, e.g., alumina covering the cavity 4, and a cooling fin 12 provided on the base 2 on the side opposite to the lead pins 8. The semiconductor chip 6 is mounted onto a metallized dice stage of, e.g., tungsten plated by nickel and gold, which stage is on the surface of the base 2 at the bottom of the cavity 4. The semiconductor chip 6 is electrically connected to the lead pins 8 by means of fine wires 14 of, e.g., gold or aluminum and through metallization patterns 16, of e.g., tungsten running in the ceramic base 2. The fine wires are bonded to each of the metallization patterns 16 and to each of terminals of the semiconductor chip 6. The metallization patterns 16 in the base reach the lead pins 8. The cooling fin 12 is attached to the base 2 with a member 18 bonded to the base 2 for carrying the cooling fin 12.

For soldering the ceramic cap 10 and the ceramic base 2, the ceramic cap 10 and the ceramic base 2 have metallization patterns 20 and 22 respectively in regions where they contact each other. The metallization pattern 20 of the cap 10 extends not only to a region of the main inner surface of the cap 10 where the cap 10 contacts the base 2, but also to the four side surfaces of the cap 10.

Figure 2:
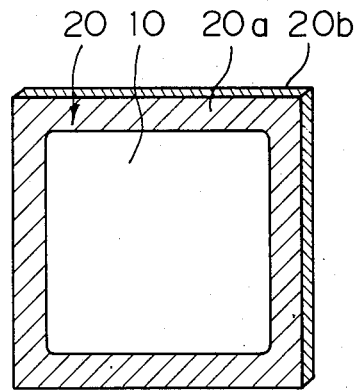
FIG. 2 is a perspective view of a ceramic cap in FIG. 1.

Referring to FIGS. 1 and 2, the ceramic cap 10 has a metallization pattern 20 including a pattern 20a on the main surface of the cap 10 along the periphery thereof, the central square or rectangular portion of the cap 10 not being covered, and a pattern 20b on the four side surfaces of the cap 10. This metallization pattern 20 is made, for example, by screen printing, e.g., tungsten paste onto the surfaces of a green ceramic cap five times, once for the main surface and four times for the four side surfaces, then firing the green cap 10 and plating nickel and gold layers on the surface of the tungsten pattern.

Figure 3A:
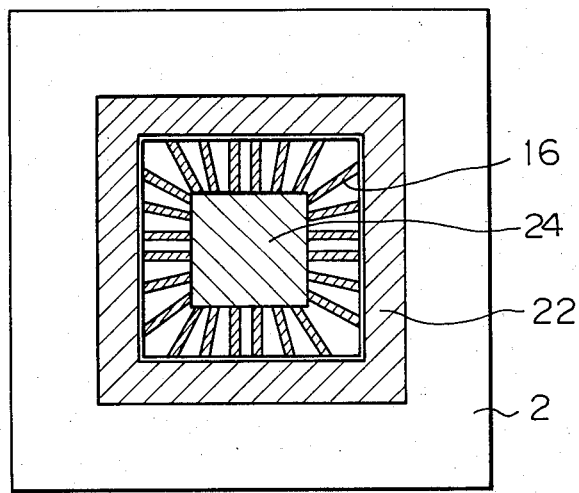
FIGS. 3a and 3b are plan and sectional views of a ceramic base in FIG. 1, respectively.
Figure 3B:
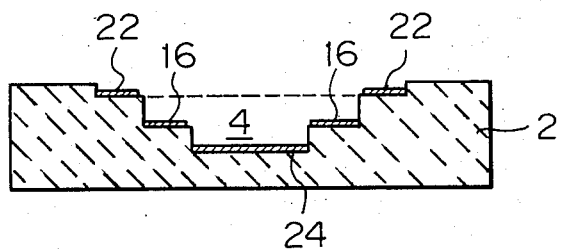

Referring to FIGS. 1, 3a, and 3b, the ceramic base 2 has a metallized dice stage 24 at the bottom of the cavity 4, metallization patterns 16 running in the ceramic base 2 and extending onto an intermediate stage in the cavity 4, and a metallization pattern for soldering 22 on the surface of a cap receiving stage, the cap receiving stage being slightly lower than the top surface of the base 10 in order to make the top surfaces of the base 2 and the cap 10 even. The base is made, for example, by shaping green ceramic sheets, screen printing and pouring metal paste on the surface and in pores of the green sheets, laminating the green sheets, and firing the lamination of the green sheets to sinter them. As in the figures, the outer edges of the metallization pattern 22 of the base 2 preferably extend slightly more outward than the cap 10. This allows formation of a meniscus by excess solder at the corners formed by the metallized top surface of the base 2 and the metallized side surfaces of the cap 10. The inner edges of the metallization pattern 22 preferably do not enter all the way to the edges of the cavity 4. This prevents overflow of metal paste into the cavity 4 due to misalignment of a screen with the cap receiving portion of the base when metal paste is screen printed.

Referring to FIGS. 1, 2, 3a, and 3b, the inner edges of the metallization pattern 20 of the cap 10 preferably extend further inward than the inner edges of the metallization pattern 22 of the base 2. This enables thorough contact between the metallization patterns 20 and 22, even if alignment between them is not complete.

Figure 4:
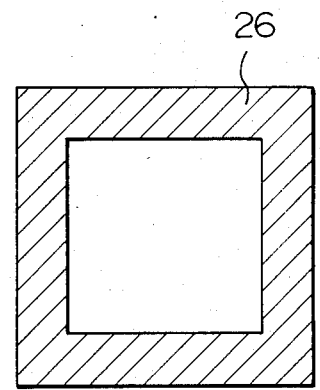
FIG. 4 is a plan view of a pattern of solder before soldering for the semiconductor device in FIG. 1.

In soldering the cap 10 to the base 2, a thin solder pattern 26 (FIG. 4) of, e.g., a gold-tin alloy (or a lead-tin alloy) 70 μm thick is inserted between the metallization patterns 20 and 22 of the base 2 and the cap 10. The volume of the solder pattern is calculated to conform with the required volume. Applying pressure of approximately $1 \times 10^5$ Pa toward the cap 10, the assembly of the base 2, the solder pattern 26, and the cap 10 is heated to a temperature of 330° C. and then cooled to solidify the solder (28 in FIG. 1). Note, the lead pins 8 are not illustrated in FIGS. 3a and 3b for simplicity.

In experiments according to the device and process described above, we found that, after soldering, flowing or flying of excess solder out of the soldering portion 28 was eliminated or greatly reduced in comparison to the case of soldering without a metallization pattern on the side surfaces of the cap. This allows a great increase in the yield of a semiconductor device including a ceramic base and a ceramic cap soldered thereto.

In experiments for fabricating semiconductor devices including a ceramic base and a ceramic cap soldered to each other and having various shapes of metallization patterns for soldering, we found that the addition of metallization to the side surfaces of the cap in addition to the region where the cap contacts the base was the most effective to avoid flow or flying of excess solder and to obtain excellent soldering or sealing of the ceramic cap and the ceramic base. We consider the reason for the effectiveness of the metallization on the side surfaces of the cap to be that corners formed by the side surfaces of the cap and the top surface of the base promote formation of various meniscuses of different shapes by excess solder, which allows absorption of different volumes of excess solder while excellent sealability between the cap and the base is obtained. In contrast, if metallization is formed extending from a region where a cap contacts a base to a portion of the main surface of the cap, the portion extending more inward than the contact region, without forming metallization on the side surfaces of the cap, the extended metallization portion absorbs excess solder but the extended metallization portion, if too large, often absorbs the solder necessary to seal the space between the cap and the base, resulting in the formation of voids in the soldering.

Figure 5:
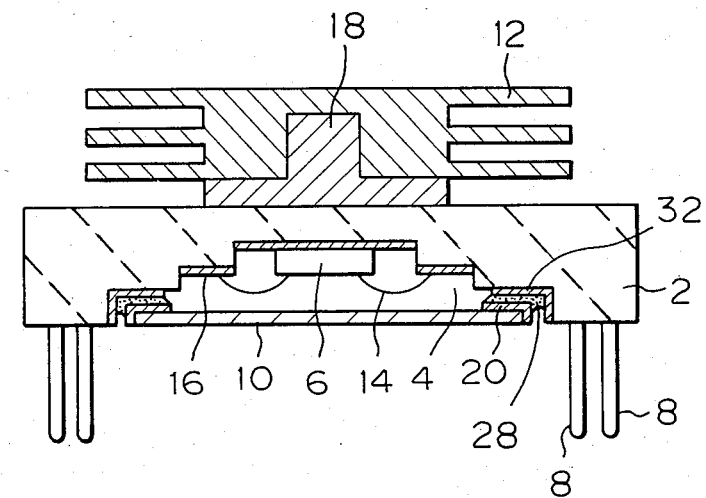
FIGS. 5 and 6 are sectional views of further semiconductor devices according to the invention.

FIG. 5 illustrates another embodiment of a semiconductor device according to the present invention. This device is the same as that in FIG. 1 except that the base 2 has a metallization pattern 32 which exists not only in the area where the base 2 is in contact with the cap 10 but also on the surfaces of the side walls of the recess of the base 2 for receiving the cap 10 to make the top surfaces of the cap 10 and the base 2 even. With this type of metallization pattern 32, a meniscus of solder may also be formed between the two metallization patterns 20 and 32 of the cap 10 and the base 2.

Figure 6:
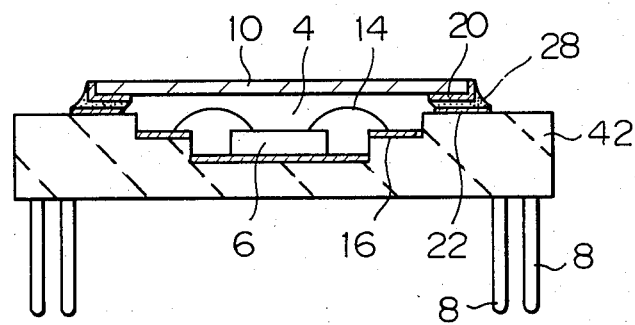

FIG. 6 illustrates a further embodiment of a semiconductor device according to the present invention. This semiconductor device is similar to the semiconductor device in FIG. 1. Parts of this semiconductor device similar to those in FIG. 1 are indicated by the same reference numerals. In this semiconductor device, however, no cooling fin is attached to a ceramic base 42, a plurality of lead pins 8 are provided on the rear side of the base 42 opposite to the side where a cavity 4 opens and a ceramic cap 10 is emplaced, and the top surface of the cap 10 is not even with the top surface of the base 42.

In this construction, the features of metallization patterns 20 and 22 as well as a thin solder pattern are the same as those in FIGS. 1, 2, 3a, 3b, and 4. It is easily understood that a semiconductor device of this embodiment has the same advantages as those of the semiconductor device in FIG. 1.

Figure 7:
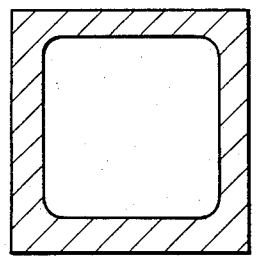
FIGS. 7 to 9 are plan views of further ceramic caps for semiconductor devices according to the invention.
Figure 8:
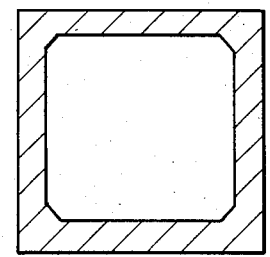
Figure 9:
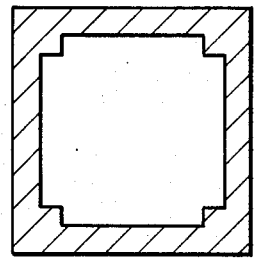

Though we described preferred embodiments of a semiconductor device according to the present invention, soldering metallization patterns of the ceramic cap and the ceramic base may be different from those described before. For example, the inner edges of the metallization pattern of the cap may extend only to a point outward from the inner edges of the metallization pattern of the base or just up to those inner edges. Alternatively, the inner edges of the metallization of the cap may extend to the edges of the cavity of the base or further inward. Further, the shape of the metallization pattern of the cap may be a rigid square or rectangle or, for example, those shown in FIGS. 7 to 9. In a particular application, the ceramic cap 10 may be a disc and the metalization of the cap 10 is resultantly in a ring pattern.

The materials of the cap, base metallizations, and solder and the process for fabricating a semiconductor device may be different from those described before. Although alumina is the most preferable at present, other materials such as alumina with added ingredients, such as beryllium oxide BeO or silicon carbide SiC are also applicable. Furthermore, a ceramic package of a so called Pin Grid Array is illustrated. Metal pads such as solder pads may be applicable instead of the pins 8.

We claim:

1. A semiconductor device comprising a semiconductor chip, an insulating base having a cavity therein carrying the semiconductor chip therewithin, and an insulating cap covering and sealing the cavity of the insulating base, wherein the insulating base and the insulating cap have respective patterns of metallization on areas of contact therebetween, the pattern of metallization of the insulating cap extending from the area of contact between the insulating base and insulating cap outwardly at least onto side surfaces of the insulating cap, the insulating base and the insulating cap being soldered to each other at the areas of the patterns of metallization.

2. A semiconductor device according to claim 1, wherein the outer edges of the metallization pattern of the base extend slightly more outward than the outer edges of the meallization pattern of the cap.

3. A semiconductor device according to claim 1, wherein the metallization pattern of the base surrounds the edges of the cavity of the base with the inner edges of the metallization pattern of the base slightly spaced from the edges of the cavity of the base.

4. A semiconductor device according to claim 1, wherein the inner edges of the metallization pattern of the cap extend slightly inward from the inner edges of the metallization pattern of the base.

5. A semiconductor dvice according to claim 1, wherein an outer main surface of the cap is substantially even with an outer surface of the base.

6. A semiconductor device according to claim 1, wherein a plruality of lead pins are provided on the base at the side where the cap is present.

7. A semiconductor device according to claim 6, wherein a cooling fin is provided on the base at the side opposite to the side where the lead pins are provided.

8. A semiconductor device according to claim 1, wherein a plurality of lead pins are provided on the base at the side opposite to the side where the cap is provided.

9. A semiconductor device according to claim 1, wherein the insulating base and the insulating cap are ceramic.

10. A semiconductor device according to claim 1, wherein the patterns of the metallization are of tungsten plated by nickel and gold.

11. A semiconductor device according to claim 1, wherein the solder is a gold-tin alloy or a lead-tin alloy.

* * * * *